United States Patent
Abe et al.

(10) Patent No.: US 9,356,252 B2
(45) Date of Patent: May 31, 2016

(54) ELECTRONIC DEVICE AND MANUFACTURING METHOD THEREFOR

(71) Applicant: JOLED INC., Tokyo (JP)

(72) Inventors: Yuuki Abe, Hyogo (JP); Kenichi Nendai, Hyogo (JP); Shuhei Yada, Osaka (JP); Kou Sugano, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/371,073

(22) PCT Filed: Jan. 10, 2013

(86) PCT No.: PCT/JP2013/000060
§ 371 (c)(1),
(2) Date: Jul. 8, 2014

(87) PCT Pub. No.: WO2013/108598
PCT Pub. Date: Jul. 25, 2013

(65) Prior Publication Data
US 2015/0001517 A1    Jan. 1, 2015

(30) Foreign Application Priority Data
Jan. 18, 2012    (JP) .................................. 2012-007797

(51) Int. Cl.
*H01L 51/52* (2006.01)
*H01L 51/56* (2006.01)
*H01L 27/32* (2006.01)

(52) U.S. Cl.
CPC ........ *H01L 51/5203* (2013.01); *H01L 27/3258* (2013.01); *H01L 51/52* (2013.01); *H01L 51/56* (2013.01); *H01L 27/3248* (2013.01); *H01L 2227/323* (2013.01)

(58) Field of Classification Search
USPC ......... 257/40, 72, 79, 82–84, 88–89, 93–100, 257/760, E23.145, E21.249, E33, E51.046; 313/504–506; 438/24, 149, 69, 72, 99, 438/FOR. 184, FOR. 201
See application file for complete search history.

(56) References Cited

U.S. PATENT DOCUMENTS

| 6,559,061 | B2 * | 5/2003 | Hashim et al. ................ 438/722 |
| 6,709,987 | B2 | 3/2004 | Hashim et al. |

(Continued)

FOREIGN PATENT DOCUMENTS

| CN | 1575063 | 2/2005 |
| JP | 05-315458 | 11/1993 |

(Continued)

OTHER PUBLICATIONS

International Search Report (ISR) in International Patent Application No. PCT/JP2013/000060, dated Mar. 19, 2013.

(Continued)

*Primary Examiner* — Michelle Mandala
(74) *Attorney, Agent, or Firm* — Greenblum & Bernstein, P.L.C.

(57) ABSTRACT

An electronic device includes a substrate, a first conductive layer disposed over the substrate, an organic insulating layer, including an organic material, disposed over the first conductive layer and having an aperture exposing a portion of the first conductive layer, a second conductive layer, which is metallic, covering a top face of the organic insulating layer, an inner circumferential face that faces the aperture in the organic insulating layer, and the exposed portion of the first conductive layer, and an intermediate layer that includes an oxide or a nitride, disposed only between the second conductive layer and the inner circumferential face that faces the aperture in the organic insulating layer. The first conductive layer and the second conductive layer are in contact at the bottom face of the aperture in the organic insulating layer.

20 Claims, 17 Drawing Sheets

(56) References Cited

U.S. PATENT DOCUMENTS

| | | |
|---|---|---|
| 2004/0080263 A1 | 4/2004 | Yamazaki et al. |
| 2005/0001963 A1 | 1/2005 | Yokoyama |
| 2005/0057151 A1* | 3/2005 | Kuwabara .................. 313/506 |
| 2005/0077816 A1 | 4/2005 | Yamada et al. |
| 2006/0145159 A1* | 7/2006 | Yokoyama et al. ............ 257/72 |
| 2006/0232600 A1* | 10/2006 | Kimura et al. ................ 345/605 |
| 2007/0063645 A1 | 3/2007 | Yokoyama |
| 2007/0066178 A1 | 3/2007 | Yamada et al. |
| 2007/0114526 A1 | 5/2007 | Yokoyama et al. |
| 2007/0278489 A1 | 12/2007 | Yamazaki et al. |
| 2008/0042290 A1 | 2/2008 | Lee et al. |
| 2009/0026445 A1* | 1/2009 | Noh et al. ...................... 257/40 |
| 2009/0302751 A1* | 12/2009 | Hanawa ...................... 313/504 |
| 2011/0273390 A1* | 11/2011 | Nakatsuji ...................... 345/173 |
| 2011/0309362 A1* | 12/2011 | Yoon et al. ...................... 257/59 |
| 2012/0175619 A1 | 7/2012 | Yamazaki et al. |
| 2013/0248836 A1 | 9/2013 | Yokoyama |
| 2013/0248837 A1 | 9/2013 | Yokoyama |
| 2014/0159026 A1 | 6/2014 | Okumoto et al. |

FOREIGN PATENT DOCUMENTS

| | | |
|---|---|---|
| JP | 05-315459 | 11/1993 |
| JP | 2004-079509 | 3/2004 |
| JP | 2004-127933 | 4/2004 |
| JP | 2004-355918 | 12/2004 |
| JP | 2005-011792 | 1/2005 |
| JP | 2005-093398 | 4/2005 |
| JP | 2006-173227 | 6/2006 |
| JP | 2007-103098 | 4/2007 |
| JP | 2009-295479 | 12/2009 |
| JP | 2010-033936 | 2/2010 |
| JP | 2010-225288 | 10/2010 |
| JP | 2010-257694 | 11/2010 |

OTHER PUBLICATIONS

Office Action from State Intellectual Property Office (SIPO) of the People's Republic of China in Chinese Patent Application No. 201380005257.X, dated Dec. 29, 2015, together with a partial English language translation.

* cited by examiner

ELECTRONIC DEVICE AND MANUFACTURING METHOD THEREFOR

TECHNICAL FIELD

The present disclosure relates to an electronic device configuration and manufacturing method for an organic electroluminescence display panel.

BACKGROUND ART

In recent years, a light-emitting element has been developed that emits light upon being supplied with electric current in a forward direction. Such light-emitting elements include an organic electroluminescence element (hereinafter also organic EL element), which employs the organic material electroluminescence effect of organic fluorescent materials to produce light, and has become widely used.

For example, Patent Literature 1 discloses organic electroluminescence display panel 901, shown in FIG. 17, as an example of an electronic device incorporating an organic EL element. The organic electroluminescence display panel 901 includes a glass substrate 911, a thin-film transistor 912, a first conductive layer 913, an organic insulating layer 921, a second conductive layer 923, an intermediate layer 935, a partition 941, a light-emitting layer 942, a third conductive layer 943, a protective layer 948, a contact layer 949, a colour filter layer 950, and a sealing layer 951. The first conductive layer 913 functions as wiring. The organic insulating layer 921 is formed over the first conductive layer 913 and has an aperture exposing a portion of the first conductive layer 913. The second conductive layer 923 is formed so as to cover layers from the organic insulating layer 921 to the first conductive layer 913, and functions as an anode. The second conductive layer 923 is made of metal. The intermediate layer 935 extends over a top face of the organic insulating layer 921, an inner circumferential face 921a that faces the aperture, and a bottom face 921b, between the organic insulating layer 921 and the second conductive layer 923. The intermediate layer 935 is made of indium tin oxide, which is a type of metallic oxide material. The light-emitting layer 942 is formed over the second conductive layer 923, and is made of an organic light-emitting material. The third conductive layer 943 is formed of an optically-transparent material and functions as a cathode. Accordingly, a configuration is achieved where electrical current flow from the first conductive layer 913 to the second conductive layer 923 occurs through the intermediate layer 935 at the bottom face 921b of the aperture in the organic insulating layer 921. Also, metallic oxide material is known to have high adhesion, with respect to organic material as well as metallic material. As such, there is high adhesion between the organic insulating layer 921 and the intermediate layer 935, and high adhesion between the intermediate layer 935 and the second conductive layer 923. Accordingly, the organic electroluminescence display panel 901 is able to constrain the organic insulating layer 921 from peeling away from the second conductive layer 923.

CITATION LIST

Patent Literature

[Patent Literature 1]
Japanese Unexamined Patent Application No. 2004-355918

[Patent Literature 2]
Japanese Unexamined Patent Application No. 2005-011792
[Patent Literature 3]
Japanese Unexamined Patent Application No. H5-315459
[Patent Literature 4]
Japanese Unexamined Patent Application No. H5-315458

SUMMARY OF INVENTION

Technical Problem

As it happens, an electronic device such as the above-described conventional organic electroluminescence display panel saves on costs by using aluminium or an aluminium alloy as the material for the second conductive layer. However, in such cases, a portion of the second conductive layer that is in contact with the intermediate layer is at risk of transformation into aluminium oxide. This is because the high bonding strength of aluminium atoms to oxygen atoms makes, for example, the aluminium atoms in the second conductive layer prone to reacting with the oxygen atoms in the indium tin oxide of the intermediate layer. Furthermore, the organic electroluminescence display panel of the above-described conventional technology has the intermediate layer formed across the entire boundary between the first conductive layer and the second conductive layer, such that the intermediate layer is also present at the bottom face of the aperture in the organic insulating layer. Thus, at the bottom face of the aperture in the organic insulating layer, having the second conductive layer portion that is in contact with the intermediate layer transform into aluminium oxide poses a risk that contact resistance may increase between the first conductive layer and the second conductive layer. This is due to the fact that aluminium oxide has low conductivity in comparison with aluminium and aluminium alloys. This problem may occur not only when aluminium or an aluminium alloy is used as the second conductive layer, but also when no indium tin oxide is used in the intermediate layer but the intermediate layer includes oxygen atoms or nitrogen atoms.

The present invention seeks to provide an electronic device in which peeling of the organic insulating layer from the second conductive layer is unlikely to occur, and in which the contact resistance between the first conductive layer and the second conductive layer is constrained.

Solution to Problem

In order to solve the problem, one aspect of the present disclosure provides an electronic device, comprising a substrate, a first conductive layer disposed over the substrate, an organic insulating layer disposed over the first conductive layer and having an aperture through which a portion of the first conductive layer is exposed, a second conductive layer, which is metallic, covering a top face of the organic insulating layer, an inner circumferential face that faces the aperture in the organic insulating layer, and the portion of the first conductive layer that is exposed, and an intermediate layer that includes one of an oxide and a nitride, disposed only between the second conductive layer and the inner circumferential face that faces the aperture in the organic insulating layer, wherein the first conductive layer and the second conductive layer are in contact within the aperture in the organic insulating layer.

Advantageous Effects of Invention

The electronic device of the present disclosure has an intermediate layer that includes an oxide or a nitride, and is formed only between the second conductive layer and an inner circumferential face that faces the aperture in the organic insulating layer. Here, the oxide or nitride is a material known to have high adhesion, with respect to organic material as well as metallic material. As such, there is high adhesion between the organic insulating layer and the intermediate layer, and high adhesion between the intermediate layer and the second conductive layer. Accordingly, forming the intermediate layer makes the organic insulating layer and the first conductive layer less likely to peel apart.

Also, the intermediate layer is not formed at the bottom face of the aperture in the organic insulating layer, such that the first conductive layer and the second conductive layer are in contact. As such, direct contact is maintained between the first conductive layer and the second conductive layer at the bottom face of the aperture in the organic insulating layer, and the contact resistance is reduced.

Accordingly, peeling of the organic insulating layer from the second conductive layer is unlikely to occur the electronic device of the present disclosure, and the contact resistance between the first conductive layer and the second conductive layer is constrained.

DESCRIPTION OF EMBODIMENTS

[Overview of Aspects]

Figure 1:
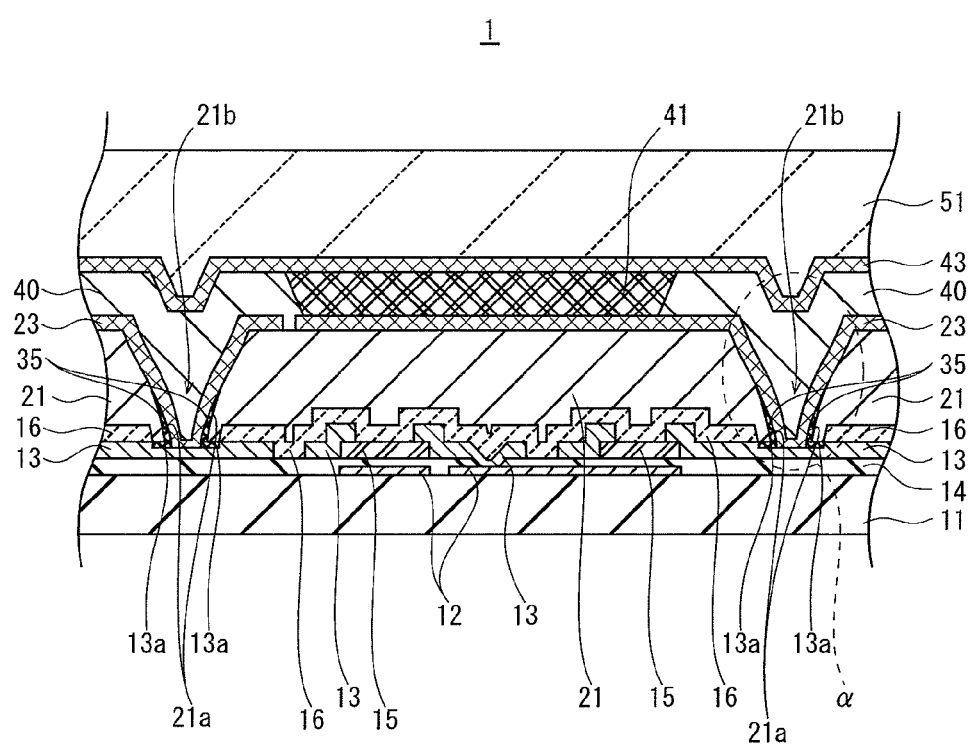
FIG. 1 is a cross-sectional diagram showing the configuration of an organic electroluminescence display panel pertaining to Embodiment 1.

In one aspect, an electronic device has a substrate, a first conductive layer disposed over the substrate, an organic insulating layer disposed over the first conductive layer and having an aperture through which a portion of the first conductive layer is exposed, a second conductive layer, which is metallic, covering a top face of the organic insulating layer, an inner circumferential face that faces the aperture in the organic insulating layer, and the portion of the first conductive layer that is exposed, and an intermediate layer that includes one of an oxide and a nitride, disposed only between the second conductive layer and the inner circumferential face that faces the aperture in the organic insulating layer, wherein the first conductive layer and the second conductive layer are in contact within the aperture in the organic insulating layer.

The electronic device has an intermediate layer that includes an oxide or a nitride, and is formed only between the second conductive layer and an inner circumferential face that faces the aperture in the organic insulating layer. Here, the oxide or nitride is a material known to have high adhesion, with respect to organic material as well as metallic material. As such, there is high adhesion between the organic insulating layer and the intermediate layer, and high adhesion between the intermediate layer and the second conductive layer. Accordingly, forming the intermediate layer makes the organic insulating layer and the first conductive layer less likely to peel apart. Also, the intermediate layer is not formed at the bottom face of the aperture in the organic insulating layer, such that the first conductive layer and the second conductive layer are in contact. As such, at the bottom face of the aperture in the organic insulating layer, the second conductive layer is constrained from transformation by the oxide or the nitride. Accordingly, peeling of the organic insulating layer from the second conductive layer is unlikely to occur in the electronic device of the present disclosure, and the contact resistance between the first conductive layer and the second conductive layer is constrained.

In another aspect, the first conductive layer is made from a metal, and the intermediate layer is made from an oxide of the metal.

In a further aspect, the intermediate layer is made from a conductive oxide material.

In an additional aspect, an insulating layer made from one of an oxide and a nitride is further disposed between the first conductive layer and the organic insulating layer, and having a corresponding aperture that corresponds with the aperture in the organic insulating layer through which the portion of the first conductive layer is exposed, wherein an intermediate layer material and an insulating layer material are identical.

In yet another aspect, the first conductive layer is made from a metal, and a metallic layer of the metal is further disposed between the intermediate layer and the second conductive layer.

In still another aspect, the first conductive layer is made from a metal, a metallic oxide layer is disposed between the first conductive layer and the organic insulating layer, the metallic oxide layer including an oxide of the metal, and a region of the first conductive layer that is directly covered by the organic insulating layer has greater surface roughness than another region of the first conductive layer that is exposed through the organic insulating layer.

In another additional aspect, the first conductive layer is made from a metal, and an oxide layer is an oxide of the metal disposed on a region of the first conductive layer covered by the organic insulating layer, between the first conductive layer and the organic insulating layer.

In another further aspect, the first conductive layer is made from a metal including at least one of tungsten, molybdenum, titanium, chromium, and copper.

In still a further aspect, the second conductive layer is made from one of an aluminium alloy and a silver alloy.

In yet a further aspect, a manufacturing method for an electronic device involves preparing a substrate, forming, from a metal, a first conductive layer over the substrate, forming, from an organic material, an organic insulating layer over the first conductive layer so as to have an aperture exposing a portion of the first conductive layer, forming an intermediate layer that includes one of an oxide and a nitride, only on an inner circumferential face of the organic insulating layer, by sputtering at least a surface of the first conductive layer that is exposed through the aperture in the organic insulating layer, and forming a second conductive layer, which is metallic, so as to cover a top face of the organic insulating layer, the inner circumferential face of the aperture in the organic insulating layer, and the portion of the first conductive layer that is exposed.

In a further additional aspect, the oxide or the nitride in the intermediate layer is a metal oxide or a metal nitride of the metal forming the first conductive layer.

In still a further aspect, at least the top face of the first conductive layer is oxidised between the forming of the first conductive layer and the forming of the intermediate layer.

In yet still another aspect, a metallic layer is formed, from the metal in the first conductive layer, over the intermediate layer by sputtering the surface of the first conductive layer between the forming of the intermediate layer and the forming of the second conductive layer.

In an alternate aspect, a manufacturing method for an electronic device involves preparing a substrate, forming, from a metal, a first conductive layer over the substrate, forming, from one of an oxide and a nitride, an insulating layer over the substrate and the first conductive layer, forming, from an organic material, an organic insulating layer over the first conductive layer and opening an aperture that exposes a portion of the first conductive layer, forming an intermediate layer from the same material as the insulating layer, only on an inner circumferential face of the organic insulating layer, by removing a partial surface of the insulating layer through sputtering so as to expose a top face of the first conductive layer and sputtering at least the surface of the insulating layer that is exposed through the aperture in the organic insulating layer, and forming a second conductive layer, which is metal-lic, so as to cover the top face of the organic insulating layer, the inner circumferential face of the aperture in the organic insulating layer, and the portion of the first conductive layer that is exposed.

Embodiment 1

1. Overall Configuration of Organic Electroluminescence Display Panel 1

FIG. 1 is a cross-sectional diagram showing the configuration of one pixel in an organic electroluminescence display panel 1, pertaining to Embodiment 1 of the disclosure.

The organic electroluminescence display panel 1 includes a glass substrate 11, a gate electrode 12, an insulating layer 14, a first conductive layer 13, a tungsten oxide layer 13a, a semiconductor layer 15, a passivation layer 16, an organic insulating layer 21, an intermediate layer 35, a second conductive layer 23, a partition 40, a light-emitting layer 41, a third conductive layer 43, and a sealing layer 51. A thin-film transistor (hereinafter, TFT) is formed by the gate electrode 12, the insulating layer 14 formed on the gate electrode 12, the first conductive layer 13 acting as a source drain (hereinafter, SD) electrode, and the semiconductor layer 15 formed over the gate electrode 12 across the insulating layer 14. The first conductive layer 13 is formed over a substrate that includes the glass substrate 11 and the insulating layer 14. The first conductive layer 13 is made of tungsten. The tungsten oxide layer 13a is formed between the first conductive layer 13 and the organic insulating layer 21, with the exception of an aperture in the organic insulating layer 21 that corresponds to an aperture in the passivation layer 16. The passivation layer 16 is formed over the first conductive layer 13 so as to cover the semiconductor layer 15 and a portion of the first conductive layer 13, and is made of silicon nitride.

Figure 2A:
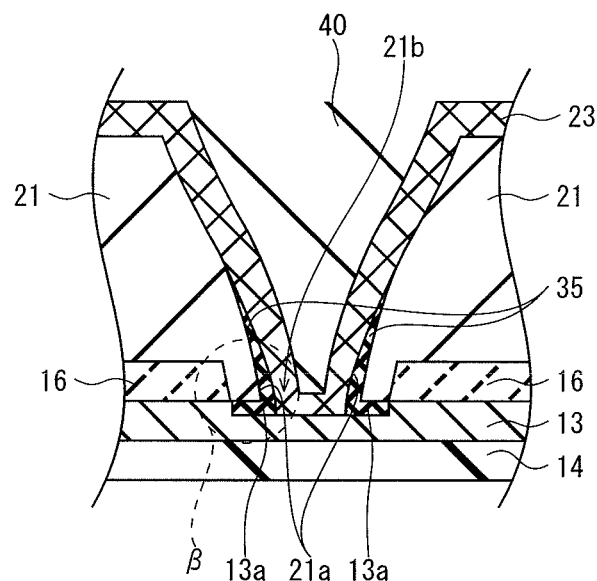
FIG. 2A is a magnified view of a vicinity of a contact portion between a first conductive layer and a second conductive layer in the organic electroluminescence display panel shown in FIG. 1.
Figure 2B:
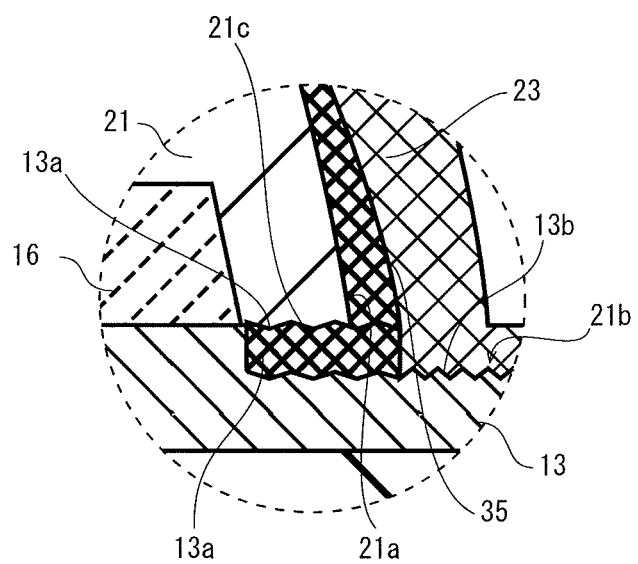
FIG. 2B is a magnified view of interface vicinity β between an intermediate layer and an organic insulating layer in the organic electroluminescence display panel.

The organic insulating layer 21 is formed over the first conductive layer 13 across the passivation layer 16. The organic insulating layer 21 has an aperture exposing a portion of the first conductive layer 13. The aperture in the organic insulating layer 21 is has a diameter that is widest at the top and narrows approaching the bottom, in an inverted taper shape. The aperture in the organic insulating layer 21 has an inner diameter of, for example, 15 µm at the top face and of 5 µm at a bottom face 21b. The thickness of the organic insulating layer 21 is, for example, 4 µm. The organic insulating layer 21 is made of an organic material having insulating properties (e.g., an acrylic resin, a polyimide resin, or similar). FIG. 2A is a magnified view of a contact portion vicinity α. As shown, the intermediate layer 35 is present on an inner circumferential face 21a of the aperture in the organic insulating layer 21, and is not present on a top face of the organic insulating layer 21 nor on a portion of the first conductive layer 13 exposed through the aperture in the organic insulating layer 21. That is, the intermediate layer 35 is formed only between the inner circumferential face 21a that faces the aperture in the organic insulating layer 21 and the second conductive layer 23. A widening region of the intermediate layer 35 is only on a half-part of the inner circumferential face 21a, arranged near the first conductive layer 13, that faces the aperture in the organic insulating layer 21. FIG. 2B illustrates the detailed configuration of an interface vicinity β between the intermediate layer 35 and the organic insulating layer 21. As shown, surface 13b of the tungsten oxide layer 13a, directly covered by the organic insulating layer 21, has greater roughness than surface 13c of the first conductive layer 13, exposed through the aperture in the organic insulating layer 21. This is thought to be due to manufacturing processes. The description now returns to FIG. 1. The second conductive layer 23 serves as an anode, and is formed over a top face of the organic insulating layer 21, the inner circumferential face 21a of the aperture in the organic insulating layer 21 through the intermediate layer 35, and the first conductive layer 13 exposed through the aperture in the organic insulating layer 21. The second conductive layer 23 is made of an aluminium alloy. At the bottom face 21b of the aperture in the organic insulating layer 21, the second conductive layer 23 is in direct contact with the first conductive layer 13, and electric current is supplied to the second conductive layer 23 from the first conductive layer 13. That is, this portion between the second conductive layer 23 and the first conductive layer 13 serves as a contact portion.

The partition 40 fits into the aperture in the organic insulating layer 21, and is made of an insulating organic material (e.g., acrylic resin). The light-emitting layer 41 is formed over the second conductive layer 23 between adjacent partitions 40, and is made of an organic light-emitting material. The third conductive layer 43 is formed so as to cover the partition 40 and the light-emitting layer 41, and serves as a cathode. The material for the third conductive layer 43 is, for example, a transparent material (e.g., indium-tin oxide (hereinafter, ITO) or indium-zinc oxide (hereinafter, IZO)). The third conductive layer 43 supplies electric power to a drive circuit disposed in the periphery of a panel portion of the organic electroluminescence display panel 1. The sealing layer 51 is formed over the third conductive layer 43, from a material serving as a gas barrier, such as silicon nitride.

2. Manufacturing Method

A manufacturing method of the organic electroluminescence display panel 1 is described with reference to the drawings, and with particular attention to the formation of the intermediate layer 35. With the exception of the below-described process, the formation of the organic electroluminescence display panel 1 uses known technology, explanations of which are omitted.

Figure 3A:
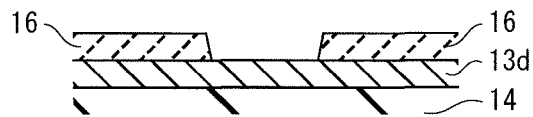
FIGS. 3A-3D are cross-sectional diagrams of a manufacturing process for the organic electroluminescence display panel shown in FIG. 1.

First, as shown in FIG. 3A, the passivation layer 16 is formed on the surface of a substrate that includes the insulating layer 14, along with a first conductive material layer 13d that is made of tungsten. Specifically, the first conductive material layer 13d is formed on the substrate, and the material for the passivation layer 16, namely silicon nitride, is deposited on the first conductive material layer 13d. Afterward, normal photolithography and etching technology are used to perform selective etching of the material for the passivation layer 16 so as to form the aperture at a desired location in the passivation layer 16, thereby exposing a portion of the surface of the first conductive material layer 13d.

Figure 3B:
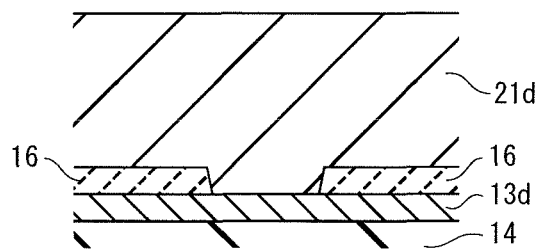

Next, as shown in FIG. 3B, an organic insulating material layer 21d is deposited so as to cover the passivation layer 16 and the exposed portion of the first conductive material layer 13d.

Figure 3C:
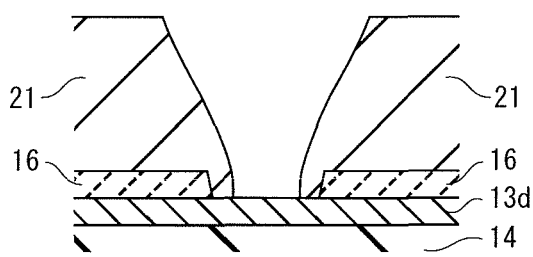

As shown in FIG. 3C, the organic insulating layer 21 is formed, with an aperture therein, over the passivation layer 16 and the exposed portion of the first conductive material layer 13d. Specifically, a photosensitive material is used for the organic insulating layer 21. Normal photolithography and etching technology is used to perform selective etching of a portion of the organic insulating material layer 21d, and firing is performed to obtain the organic insulating layer 21 with the aperture formed therein.

Figure 3D:
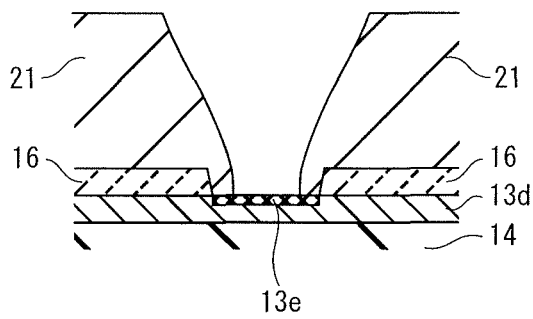

Next, as shown in FIG. 3D, the portion of the surface of the first conductive material layer 13d, made of tungsten, that is exposed through the passivation layer 16, is transformed into a metallic oxide film 13e made of tungsten oxide. Specifically, annealing is performed to oxidise a portion of the surface of the first conductive material layer 13d. The partial oxidation of the first conductive material layer 13d may be combined with the firing described with reference to FIG. 3C.

Figure 4A:
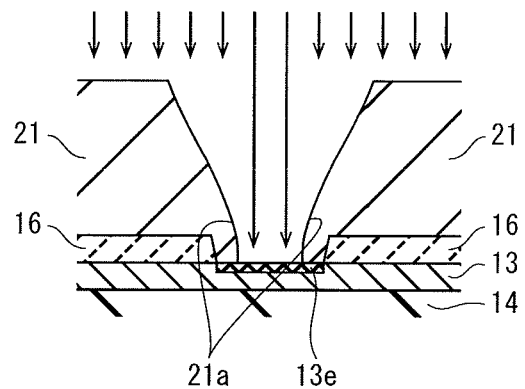
FIGS. 4A-4C are cross-sectional diagrams of the manufacturing process for the organic electroluminescence display panel shown in FIG. 1.

As shown in FIG. 4A, a reverse sputtering method employing an inert gas is used to cause a portion of the metallic oxide film 13e to adhere to the inner circumferential face 21a that faces the aperture in the organic insulating layer 21. The reverse sputtering method involves using a specific layer of the substrate as a target and causing inert gas ions to collide with the target, such that atoms from the target fly off the target. In the present Embodiment, inert gas ions of argon, for example, collide with the metallic oxide film 13e, made of tungsten oxide, in the direction indicated by the arrows. As a result, the tungsten oxide flies off the metallic oxide film 13e. Most of the tungsten oxide that flies off adheres to the inner circumferential face 21a that faces the aperture in the organic insulating layer 21. The conditions for the reverse sputtering method are that a direct current (hereinafter, DC) sputtering device having parallel plane electrodes is used, the DC power is no less than 1.0 kW and no more than 1.5 kW, the argon gas pressure is no less than 0.3 Pa and no more than 7 Pa, and the argon gas flow is no less than 100 sccm and no more than 200 sccm.

As shown in FIG. 4A, the process illustrated in FIG. 4A results in the formation of the intermediate layer 35 only on the inner circumferential face 21a that faces the aperture in the organic insulating layer 21.

Figure 4B:
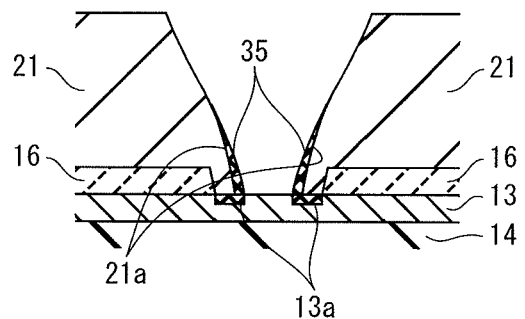
Figure 4C:
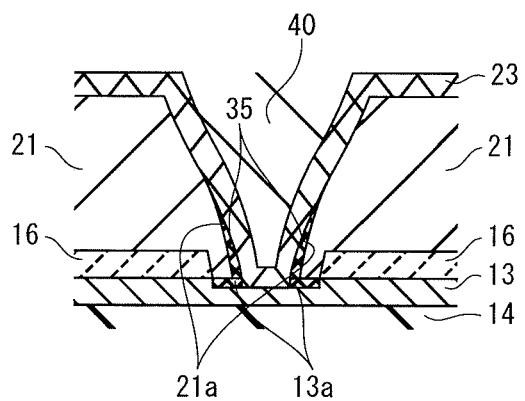

Then, as shown by FIG. 4C, the partition 40 is formed in the aperture of the organic insulating layer 21 after the second conductive layer 23 is formed.

3. Inquiry

The following discusses the formation mechanism of the intermediate layer 35, and describes the configuration of the intermediate layer 35 as well as results of composition checking.

(3-1) Intermediate Layer 35 Configuration

Figure 5A:
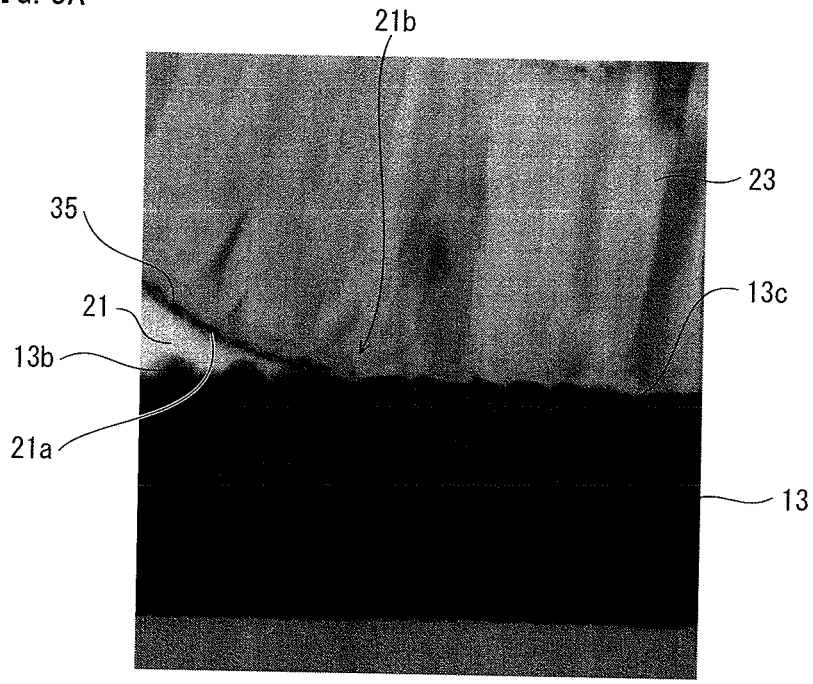
FIG. 5A shows an image, captured using transmission electron microscopy, of the contact portion in the organic electroluminescence display panel shown in FIG. 1.
Figure 5B:
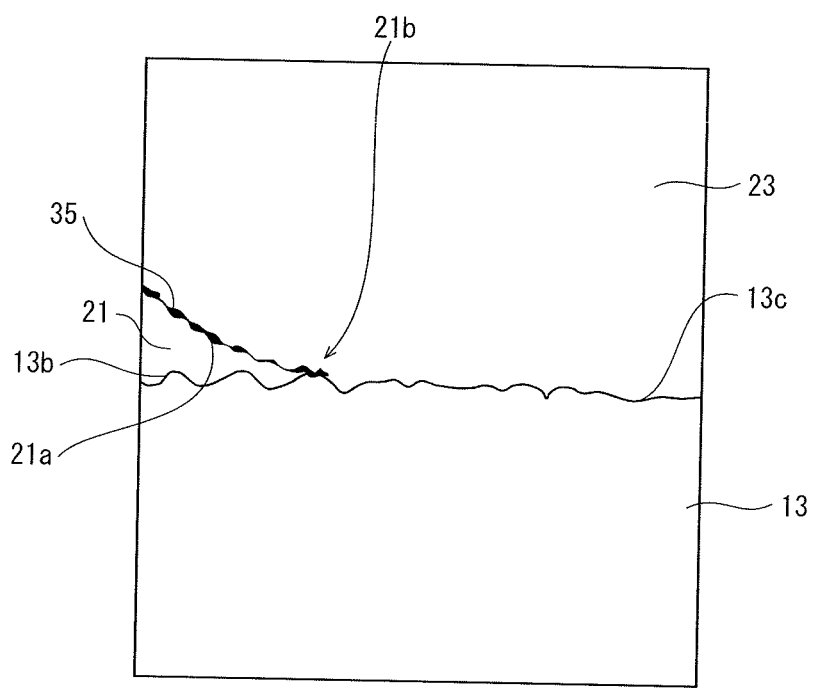
FIG. 5B is a trace diagram of the image from FIG. 5A.

The configuration of the organic insulating layer 21 formed using the above-described method was examined by scanning using transmission electron microscopy (hereinafter, TEM). FIG. 5A shows an image captured using TEM and FIG. 5B shows a trace diagram of the captured image, representing the contact portion in the present Embodiment of the organic electroluminescence display panel 1. The tungsten oxide layer 13a is not shown in FIGS. 5A and 5B, but is considered to be present between the first conductive layer 13 and the organic insulating layer 21. This is caused by the fact that the tungsten oxide layer 13a and the first conductive layer 13 have the same thickness in TEM.

As shown in FIGS. 5A and 5B, the intermediate layer 35 extends between the organic insulating layer 21 and the second conductive layer 23. Accordingly, applying the above-described manufacturing method was confirmed as forming the intermediate layer 35 on the inner circumferential face 21a that faces the organic insulating layer 21. Also, surface 13b of the tungsten oxide layer 13a directly covered by the organic insulating layer 21 was confirmed as having greater roughness than surface 13c of the first conductive layer 13 exposed through the aperture in the organic insulating layer 21.

(3-2) Intermediate Layer 35 Composition

Figure 6:
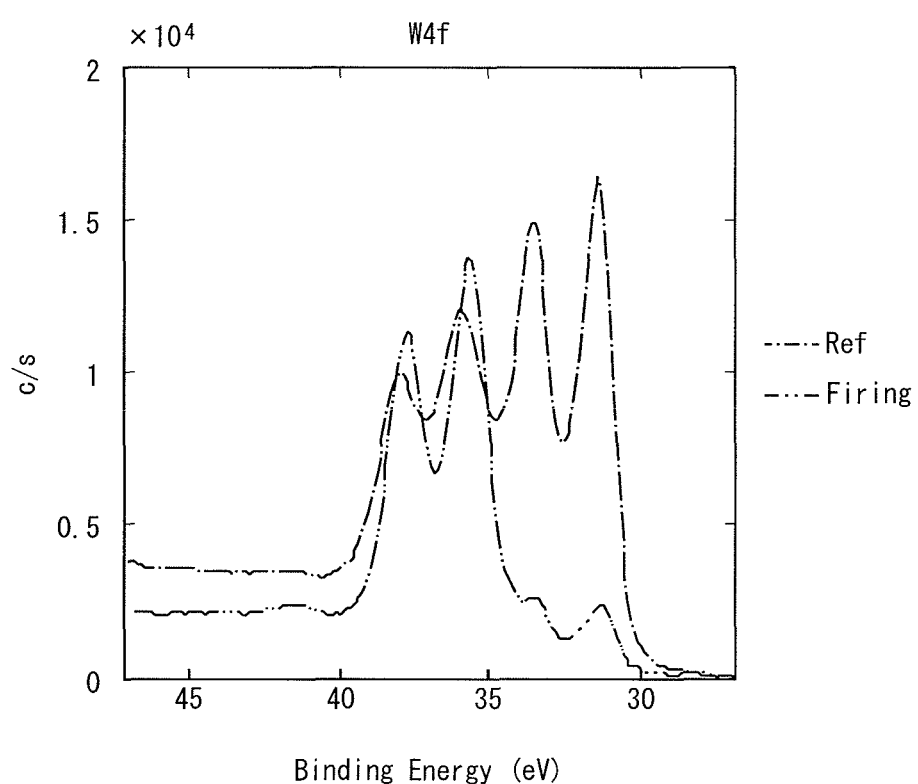
FIG. 6 is a graph of the 4 f orbitals of tungsten, obtained by X-ray photoelectron spectroscopy performed on an inner circumferential face that faces an aperture in an organic insulating layer of the organic electroluminescence display panel shown in FIG. 1.

Furthermore, X-Ray photoelectron spectroscopy was used to examine the inner circumferential face 21a that faces the aperture in the organic insulating layer 21 formed using the above-described manufacturing method. FIG. 6 is a graph of the 4 f orbitals of tungsten, obtained by XPS performed on the inner circumferential face 21a that faces the aperture in the organic insulating layer 21 of the organic electroluminescence display panel shown in FIG. 1. Measuring the 4 f orbital of tungsten reveals two peaks when the tungsten is present in simple metallic form, and four peaks when the tungsten is present as tungsten oxide. FIG. 6 illustrates measurement results for a case where the oxidation process illustrated in FIG. 3D has not been performed (i.e., a comparative example), and a case where the oxidation process has been performed (i.e., the present Embodiment). The single-chained line corresponds to the comparative example and the double-chained line corresponds to the present Embodiment. As shown in FIG. 6, the comparative example has tungsten on the surface thereof, whereas the present Embodiment has tungsten oxide. As such, the intermediate layer 35 if the organic electroluminescence display panel 1 formed using the above-described manufacturing method is confirmed as being made of tungsten oxide.

(3-3) Formation Mechanism of Intermediate Layer 35

Figure 7A:
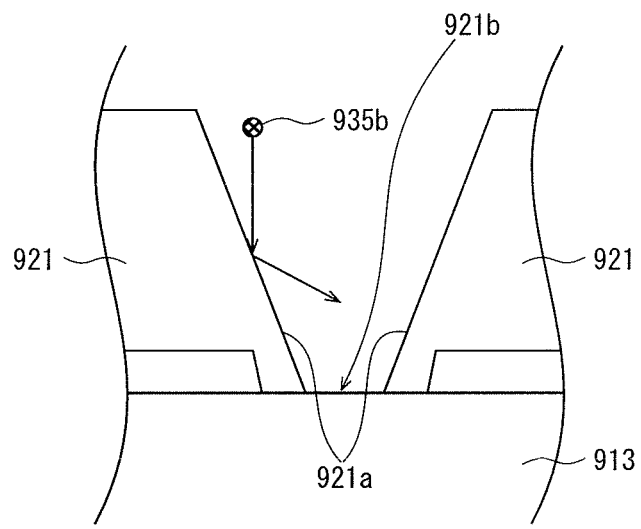
FIG. 7A is a schematic diagram of an intermediate layer formation process pertaining to a comparative example.

Additionally, the formation of the intermediate layer 35 using the reverse sputtering method of the above-described manufacturing method is described in detail with reference to the drawings. FIG. 7A is a schematic diagram of an intermediate layer formation process pertaining to Patent Literature 1, and FIG. 7B is a schematic diagram of the intermediate layer formation process pertaining to the present Embodiment.

As shown in FIG. 7A, forming a conventional intermediate layer 935 involves using the sputtering method after forming an aperture in a organic insulating layer 921. Here, ITO 935b, a metallic oxide used as the material for the intermediate layer 935, is sputtered from above onto a bottom face 921b and an inner circumferential face 921a that faces the aperture in the organic insulating layer 921 from the top face of the organic insulating layer 921. However, given that the incidence angle of the ITO 935b is shallow, especially for the inner circumferential face 921a that faces the aperture in the organic insulating layer 921, the ITO 935b tends to have difficulty adhering to the inner circumferential face 921a. As such, an insufficient amount of the ITO 935b adheres to the inner circumferential face 921a that faces the aperture in the organic insulating layer 921, and the intermediate layer 935 may be overly thin. Here, the sputtering method is technology that involves providing a target above the substrate and causing the inert gas to collide with the target, so as to cause target atoms to fly from the target and adhere to the substrate.

Figure 7B:
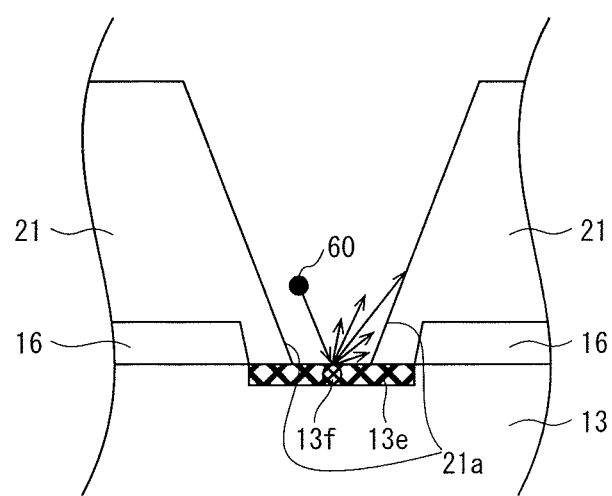
FIG. 7B is a schematic diagram of an intermediate layer formation process pertaining to the present Embodiment.

Conversely, as shown in FIG. 7B, the present Embodiment uses a reverse sputtering method in which the metallic oxide film 13e formed on the first conductive layer 13 of the substrate serves as the target. The reverse sputtering method causes the tungsten oxide 13f to fly off the metallic oxide film 13e due to ions of the inert gas argon 60 colliding with the metallic oxide film 13e formed on the first conductive layer 13. Given that the tungsten oxide 13f files off at various angles, the incidence angle of the tungsten oxide 13f onto the inner circumferential face 21a that faces the aperture in the organic insulating layer 21 is deep. Therefore, the tungsten oxide 13f is able to adhere to the inner circumferential face 21a despite the sharp incline of the inner circumferential face 21a that faces the aperture in the organic insulating layer 21. As such, a sufficient thickness of tungsten oxide is assured on the inner circumferential face 21a that faces the aperture in the organic insulating layer 21. Accordingly, the thickness of the intermediate layer 35 is constrained from being too small, relative to the perpendicular direction of the inner circumferential face 21a that faces the aperture in the organic insulating layer 21. Also, the tungsten oxide 13f is unlikely to adhere to the top of the organic insulating layer 21 given that the reverse sputtering method is used. Also, the tungsten oxide 13f adheres to the inner circumferential face 21a that faces the aperture in the organic insulating layer 21 with increasing ease approaching the bottom face from the top face. Thus, the intermediate layer 35 is thinnest at the top of the aperture and increases in thickness approaching the bottom face, relative to the perpendicular direction of the inner circumferential face 21a that faces the aperture of the organic insulating layer 21. Furthermore, given that the tungsten oxide 13f flies off the metallic oxide film 13e formed on the first conductive layer 13, then as shown in FIG. 2B, with respect to the perpendicular direction of the substrate, the first conductive layer 13 is thinner at the bottom face 21b of the aperture in the organic insulating layer 21, relative to other portions thereof.

4. Effects

In the present Embodiment, an intermediate layer 35 made of tungsten oxide is formed between the second conductive layer 23 and the inner circumferential face 21a that faces the aperture in the organic insulating layer 21. The tungsten oxide is known to have high adhesion, with respect to organic material as well as metallic material. As such, there is high adhesion between the organic insulating layer 21 and the intermediate layer 35, and high adhesion between the intermediate layer 35 and the second conductive layer 23. Accordingly, forming the intermediate layer 35 makes the organic insulating layer 21 and the second conductive layer 23 less likely to peel apart.

Also, in the present Embodiment, the reverse sputtering method using an inert gas causes flying off of atoms from the tungsten oxide 13f forming the metallic oxide film 13e on the first conductive layer 13. Accordingly, the tungsten oxide adheres to the inner circumferential face 21a that faces the aperture in the organic insulating layer 21 to form the intermediate layer 35. Thus, as described above, the sputtering from above the organic insulating layer 21 of material from the intermediate layer 35 enables the thickness of the intermediate layer 35 to be sufficiently preserved at the inner circumferential face 921a that faces the aperture in the organic insulating layer 921.

Figure 8A:
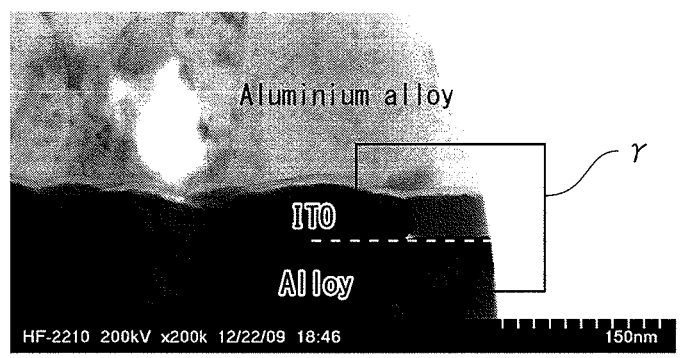
FIG. 8A is a cross-sectional diagram of the organic electroluminescence display panel pertaining to Embodiment 1.
Figure 8B:
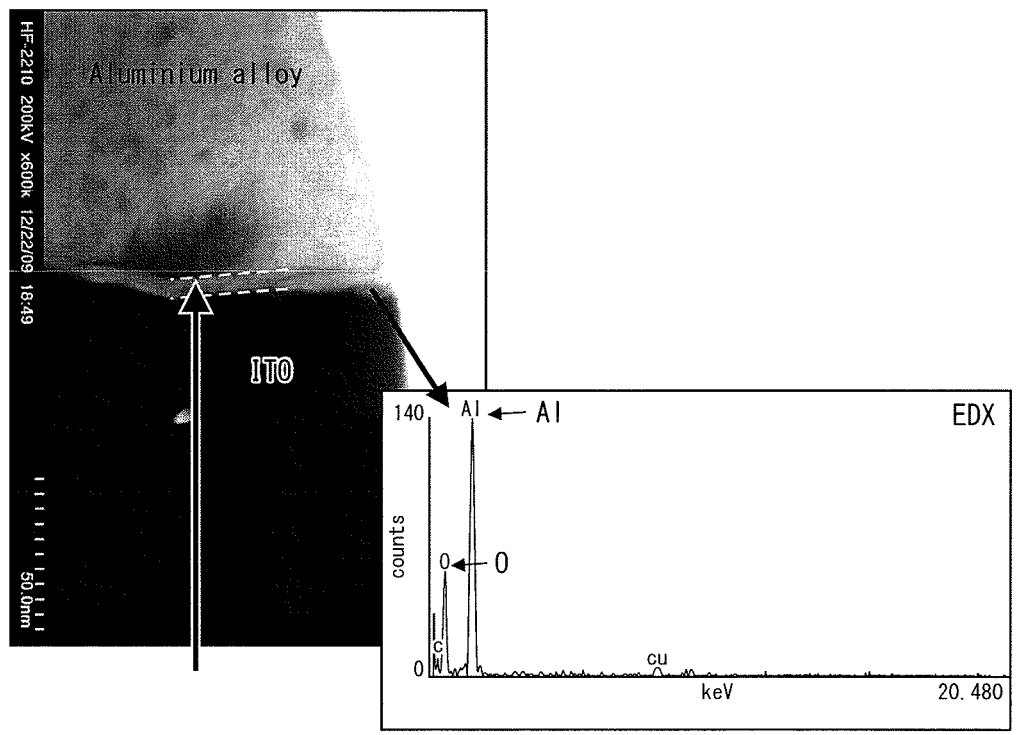
FIG. 8B is a magnified view accompanied by an energy dispersive X-ray spectrogram of FIG. 8A.

Furthermore, in the present Embodiment, the contact resistance between the first conductive layer 13 and the second conductive layer 23 is expected to be constrained. This is described by way of considerations regarding the contact between the first conductive layer 13 and the second conductive layer 23. FIGS. 8A and 8B illustrate a comparative example in which an aluminium alloy is used as the material for the second conductive layer 23 and the intermediate layer 35, being made of ITO, is formed over the entire area between the first conductive layer 13 and the second conductive layer 23 including the bottom face 21b of the aperture in the organic insulating layer 21. FIG. 8A is an image captured by TEM and FIG. 8B is a magnified view of FIG. 8A combined with a measurement obtained by Energy Dispersive X-Ray spectroscopy (hereinafter, EDX). The contact portion between the aluminium alloy of the second conductive layer 23 and the UTO of the intermediate layer 35 has a thickness of 7 nm to 10 nm or more, and aluminium oxide is also present. Forming the contact portion between the second conductive layer 23 and the intermediate layer 35 in this manner causes the contact portion on the second conductive layer 23 to react with oxygen items in the intermediate layer 35, which leads to transformation into aluminium oxide. As such, there is a risk that the contact resistance of the second conductive layer 23 may be high in portions thereof that are in contact with the intermediate layer 35. However, in the present Embodiment, the intermediate layer 35 is not present on the bottom face 21b of the aperture in the organic insulating layer 21. The first conductive layer 13 and the second conductive layer 23 are in contact. Accordingly, the contact resistance is small as direct contact is maintained between the first conductive layer 13 and the second conductive layer 23.

Figure 9:
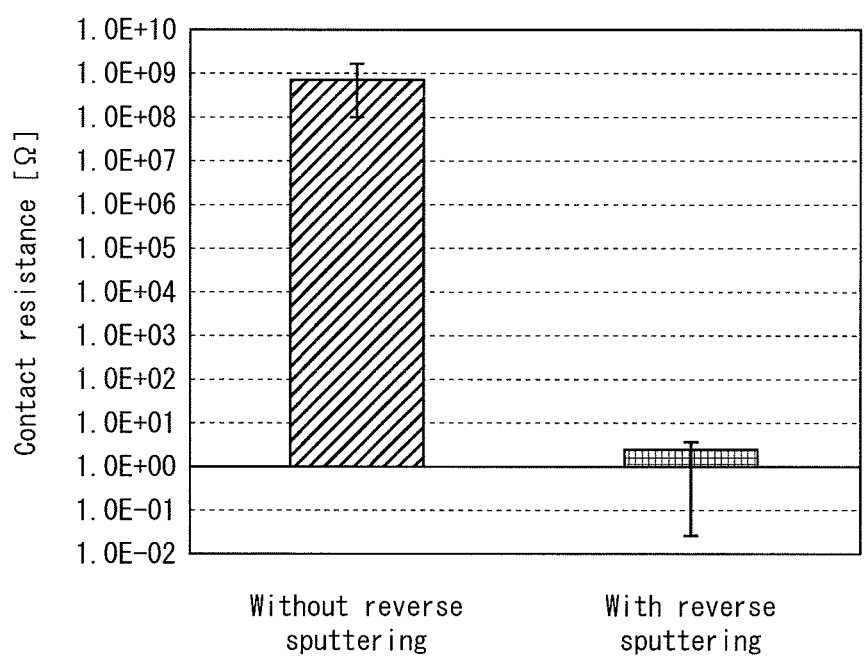
FIG. 9 indicates contact resistance values for a sample in which reverse sputtering is not used, and a sample in which the reverse sputtering of the Embodiment is used.

FIG. 9 compares the contact resistance in a sample in which reverse sputtering is not performed (i.e., the comparative example) to the contact resistance of a sample of the present Embodiment, in which reverse sputtering is performed. In the comparative example, the contact resistance reaches a value as high as $10^9 \Omega$. In contrast, the sample of the present Embodiment using the reverse sputtering has a contact resistance as low as $2\Omega$.

Also, the tungsten of the first conductive layer 13 is oxidised between the first conductive layer 13 and the organic insulating layer 21. As such, a tungsten oxide layer 13a is formed from tungsten oxide. The tungsten oxide layer 13a is unlikely to peel away from the first conductive layer 13, since the tungsten oxide layer 13a is formed by transformation of the first conductive layer 13. The organic insulating layer 21 and the tungsten oxide layer 13a also have high adhesion. Therefore, the first conductive layer 13 and the organic insulating layer 21 are unlikely to peel apart.

Furthermore, as described with reference to FIG. 2B, surface 13b of the tungsten oxide layer 13a directly covered by the organic insulating layer 21 has greater roughness than surface 13c of the first conductive layer 13 exposed through the aperture in the organic insulating layer 21. As surface 13b is roughened, mechanical properties of the surface enable greater adhesion between the organic insulating layer 21 and the tungsten oxide layer 13a. As a result, the first conductive layer 13 and the organic insulating layer 21 are even less likely to peel apart.

Embodiment 2

1. Configuration

Figure 10:
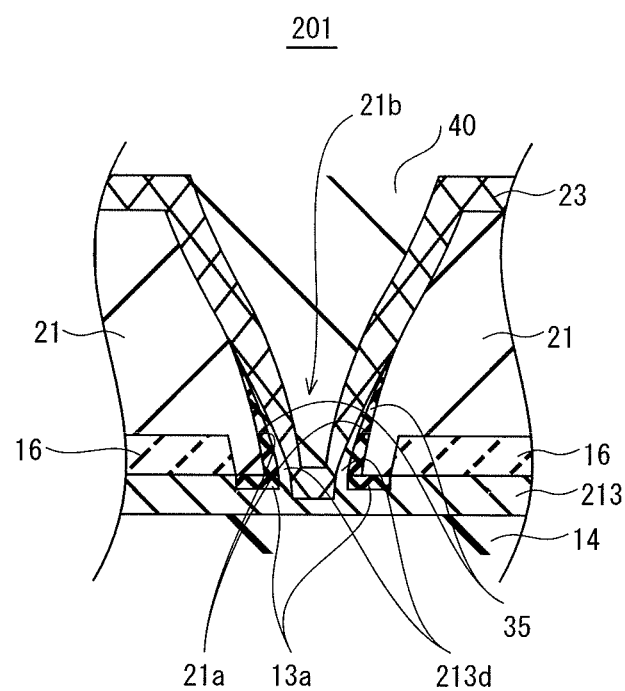
FIG. 10 is a cross-sectional diagram showing the configuration of an organic electroluminescence display panel pertaining to Embodiment 2.

FIG. 10 is a cross-sectional diagram of an organic electroluminescence display panel 201 pertaining to Embodiment 2. In Embodiment 2, a metallic layer is formed from a metallic oxide over the intermediate layer. The below-provided description of the configuration omits portions that are identical to organic electroluminescence display panel 1.

As shown in FIG. 10, the organic electroluminescence display panel 201 has an extended portion 213d, which is a metallic layer, formed between the intermediate layer 35 and the second conductive layer 23 at the inner circumferential face 21a that faces the aperture in the organic insulating layer 21. The extended portion 213d is formed from the same metal as the first conductive layer 213, namely tungsten.

2. Manufacturing Method

A manufacturing method of the organic electroluminescence display panel 201 is described with reference to the drawings, and with particular attention to the formation of the intermediate layer 35 and the extended portion 213d of the first conductive layer 213.

Figure 11A:
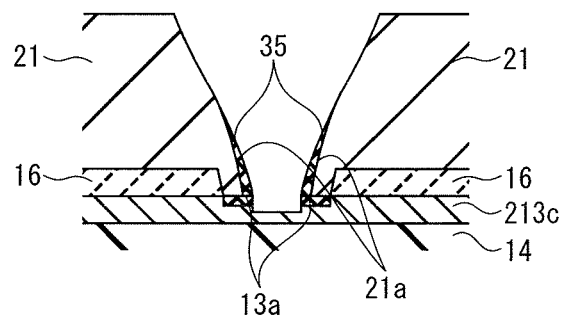
FIGS. 11A-11D are cross-sectional diagrams of the manufacturing process for the organic electroluminescence display panel shown in FIG. 10.

FIG. 11A shows the formation of the intermediate layer 35 on the inner circumferential face 21a of the aperture in the organic insulating layer 21. Specifically, after forming the metallic oxide film on the first conductive material layer 213c using the method illustrated in FIGS. 3A through 3D, the reverse sputtering method using inert gas as illustrated in FIGS. 4A and 4B is used to cause a portion of the metallic oxide film to adhere to the inner circumferential face 21a of the aperture in the organic insulating layer 21.

Figure 11B:
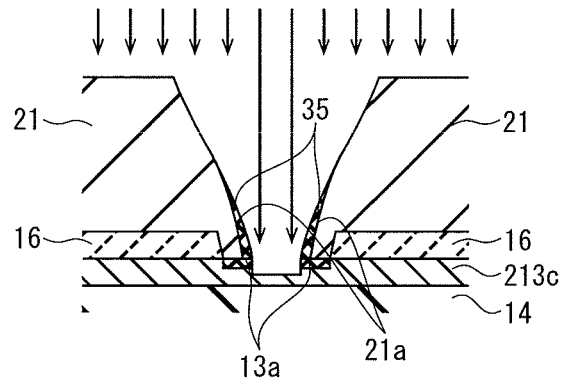

Further, as shown in FIG. 11B, the reverse sputtering method using the inert gas, as illustrated in FIGS. 4A and 4B, causes a portion of the first conductive material layer 213c to adhere to the intermediate layer 35 formed over the inner circumferential face 21a of the aperture in the organic insulating layer 21. In the present Embodiment, ions of the inert gas (e.g., argon) collide with the first conductive material layer 213c in the direction shown by the arrows, causing tungsten to fly off from the first conductive layer 213. Most of the tungsten that flies off adheres to the intermediate layer 35 formed over the inner circumferential face 21a of the aperture in the organic insulating layer 21. The conditions for the reverse sputtering method are that a DC sputtering device having parallel plane electrodes is used, the DC power is no less than 1.0 kW and no more than 1.5 kW, the argon gas pressure is no less than 0.3 Pa and no more than 7.0 Pa, and the argon gas flow is no less than 100 sccm and no more than 200 sccm.

Figure 11C:
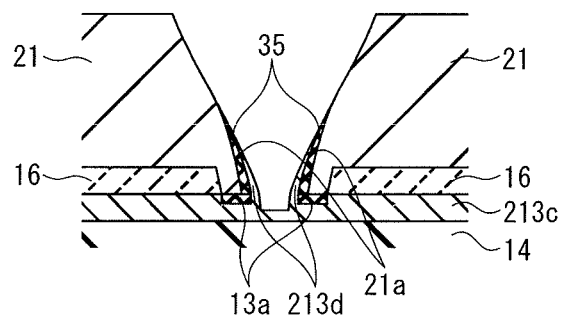

As a result of the process shown in FIG. 11B, the extended portion 213d is formed from tungsten, identically to the first conductive layer 213, in addition to the intermediate layer 35, on the inner circumferential face 21a of the aperture in the organic insulating layer 21 as shown in FIG. 11C.

Figure 11D:
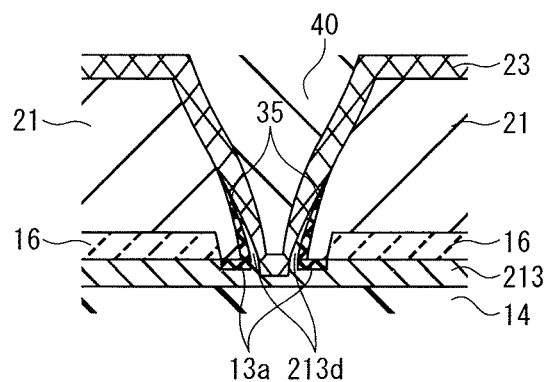

Next, as shown in FIG. 11D, the second conductive layer 23 is formed, and the partition 40 is also formed in the aperture of the organic insulating layer 21.

3. Effects

The extended portion 213d is additionally formed from tungsten between the intermediate layer 35 and the second conductive layer 23. Also, the extended portion 213d and the second conductive layer 23 have a contact surface at the interface between the aluminium alloy layer and the tungsten layer, inside the aperture in the organic insulating layer 21. The contact surface has a greater surface area than the bottom of the aperture in the organic insulating layer 21. Also, there is no contact resistance between the extended portion 213d and a first electrode layer 213. Thus, according to this configuration, the contact resistance is more constrained than in Embodiment 1. In order to achieve this result, the extended portion 213d must be constructed from the same metallic material as the first conductive layer 213. When the extended portion 213d is made from the same metallic material as the second conductive layer 32, the effect of Embodiment 1 is produced with no change in contact resistance. Also, when the extended portion 213d is made from a material different from the first conductive layer 213 and the second conductive layer 23, no effect is produced as contact resistance occurs between the first conductive layer 213 and the extended portion 213d.

[Variations]

Although the present disclosure has been described above with reference to the Embodiments, no limitation is intended thereto. Variations on the above-described Embodiments are provided below.

1. Oxidation Method for First Conductive Layer

In the Embodiments, annealing or baking is used to oxidise the first conductive layer. However, no limitation is intended regarding the oxidation method used for the first conductive layer. For example, as shown in FIGS. 12A-12D and 13A-

13D, molecular oxygen ashing may be used to oxidise a part of the surface of the first conductive layer 13.

Figure 12A:
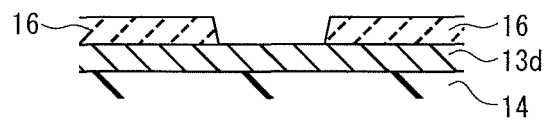
FIGS. 12A-12D are cross-sectional diagrams of the manufacturing process for the organic electroluminescence display panel shown in FIG. 1.
Figure 12B:
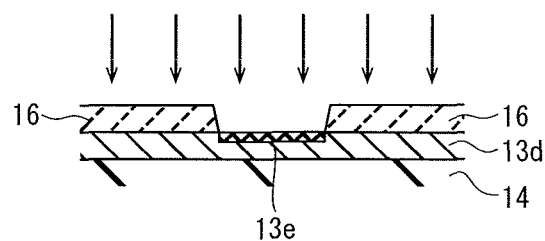
Figure 12C:
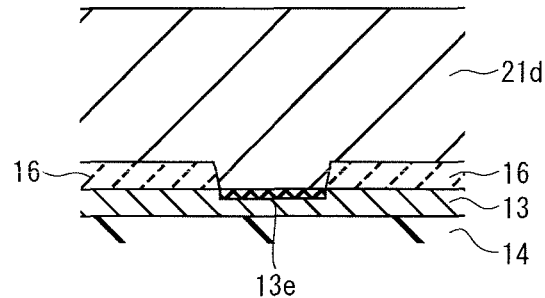
Figure 12D:
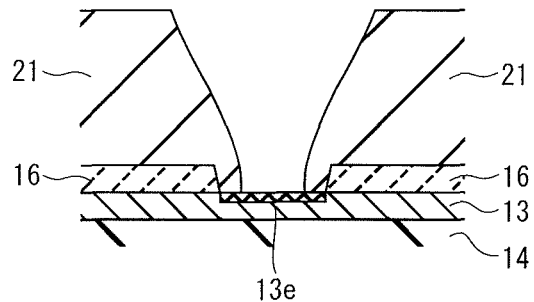

FIGS. 12A-12D illustrate a process in which molecular oxygen ashing is performed after the formation of the first conductive material layer 13d. First, as shown in FIG. 12A and similarly to FIG. 3A, the first conductive material layer 13d is prepared over a substrate that includes the insulating layer 14, from the tungsten that forms the passivation layer 16. Next, as shown in FIG. 12B, ashing is performed using molecular oxygen plasma, for example. This causes a portion of the surface of the first conductive material layer 13d, which is made of tungsten, to transform into a metallic oxide film 13e made of tungsten oxide, this portion being where the passivation layer 16 is not formed. Afterward, as shown in FIGS. 12C and 12D, the organic insulating layer 21 is formed with an aperture therein, using the photolithography and etching technology discussed with reference to FIGS. 3B and 3C.

Figure 13A:
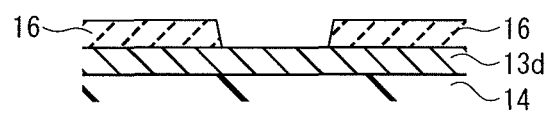
FIGS. 13A-13D are cross-sectional diagrams of a variant manufacturing process for the organic electroluminescence display panel shown in FIG. 1.
Figure 13B:
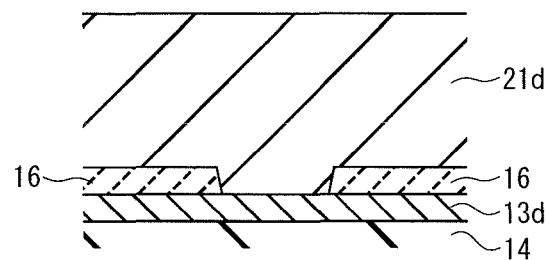
Figure 13C:
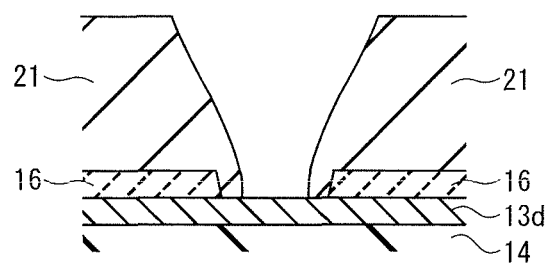
Figure 13D:
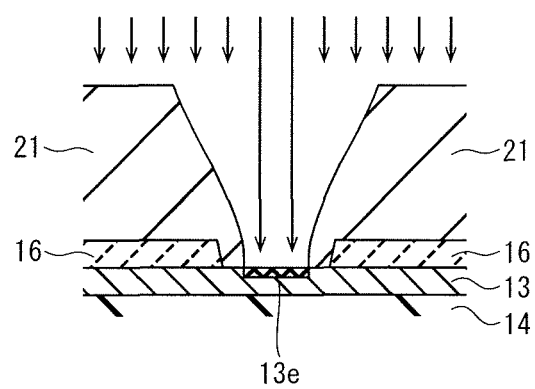

Conversely, FIGS. 13A-13D illustrate a process of performing the molecular oxygen ashing after forming the organic insulating layer 21 with the aperture therein. First, as shown in FIG. 13A and similarly to FIG. 3A, the first conductive material layer 13d is prepared over a substrate that includes the insulating layer 14, from the tungsten that forms the passivation layer 16. Next, as shown in FIGS. 13B and 13C, the organic insulating layer 21 is formed with an aperture therein, using the photolithography and etching technology discussed with reference to FIGS. 3B and 3C. Next, as shown in FIG. 13D, ashing is performed using molecular oxygen plasma, for example. This causes a portion of the surface of the first conductive material layer 13d, which is made of tungsten, to transform into a metallic oxide film 13e made of tungsten oxide, this portion being where the passivation layer 16 is not formed.

2. Intermediate Layer Material

In the Embodiments, the intermediate layer is described as being made of tungsten oxide, or of a combination of tungsten and tungsten oxide. However, no such limitation is intended. The intermediate layer may also include an oxide or a nitride. The oxide or the nitride may also include an oxynitride. A specific example is described below.

2-1. Conductive Oxide Material

The intermediate layer may be formed from a conductive oxide material, such as ITO. Forming the intermediate layer 335 from a conductive oxide material that is more conductive than tungsten oxide causes current to flow through the interface between the intermediate layer 335 and the first conductive layer 13 at the bottom of the aperture in the organic insulating layer 21. As a result, the contact resistance between the first conductive layer 13 and the second conductive layer 23 is further constrained at the bottom of the aperture in the organic insulating layer 21. With reference to FIGS. 14A-14F, the following describes a formation method for an organic electroluminescence element that includes an intermediate layer made of ITO as an example of an intermediate layer made from a conductive oxide.

Figure 14A:
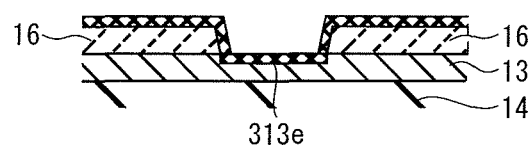
FIGS. 14A-14F are cross-sectional diagrams of a variant manufacturing process for the organic electroluminescence display panel shown in FIG. 1.

First, as shown in FIG. 14A, the first conductive layer 13 is formed from tungsten over a substrate that includes the insulating layer 14, along with a passivation layer 16 and a metallic oxide film 313e made of ITO.

Figure 14B:
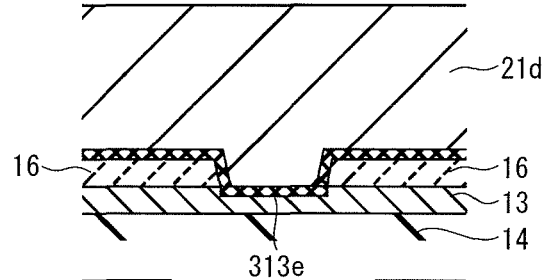
Figure 14C:
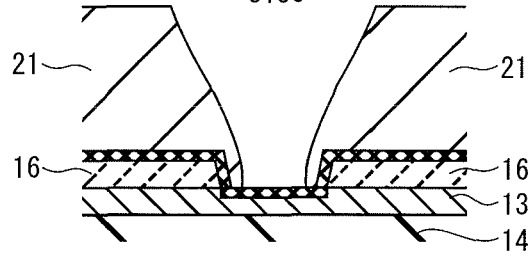

Next, as shown in FIGS. 14B and 14C, the organic insulating layer 21 is formed with an aperture therein, using the photolithography and etching technology discussed with reference to FIGS. 3B and 3C.

Figure 14D:
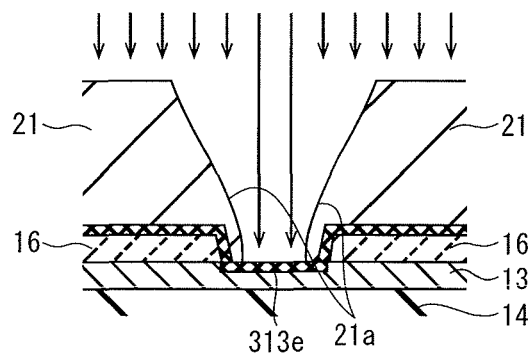

Then, as shown in FIG. 14D, the reverse sputtering method using the inert gas is used to cause a portion of the metallic oxide film 313e made of ITO to adhere to the inner circumferential face 21a of the aperture in the organic insulating layer 21, as described earlier with reference to FIG. 4A.

Figure 14E:
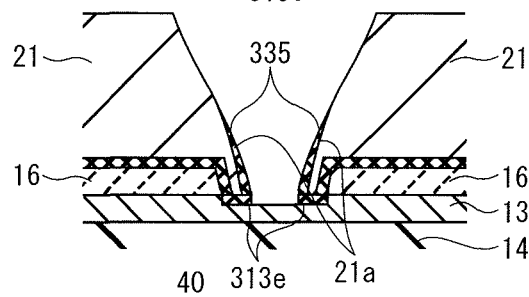

As a result of FIG. 14D, the intermediate layer 335 is formed from ITO on the inner circumferential face 21a of the aperture in the organic insulating layer 21, as shown in FIG. 14E.

Figure 14F:
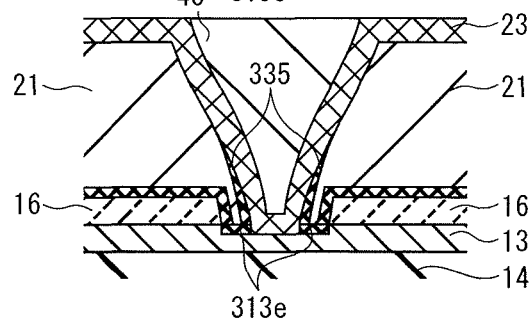

Afterward, as shown in FIG. 14F, the second conductive layer 23 formed and the partition 40 is formed in the aperture of the organic insulating layer 21, similar to FIG. 4C. In FIG. 14F, the first conductive layer 13 is indented by the aperture in the insulating layer 21. However, this is an effect of the reverse sputtering, and this example illustrates a case where the surface of the first conductive layer 13 is also subject to reverse sputtering. The surface of the first conductive layer 13 need not be indented in this manner.

2-2. Same Material as Passivation Layer

The intermediate layer may also be formed from the material used for the passivation layer. When the passivation layer and the intermediate layer are formed from the same material, there is no need to use a new material to form the intermediate layer. The formation process for the intermediate layer may also involve performing the reverse sputtering with the inert gas as described above, in cases where the passivation layer and the intermediate layer are formed from the same material. A manufacturing method of an organic electroluminescence element that includes an intermediate layer made of silicon nitride is described with reference to FIGS. 15A-15D, as an example of an intermediate layer made of the same material as the passivation layer.

Figure 15A:
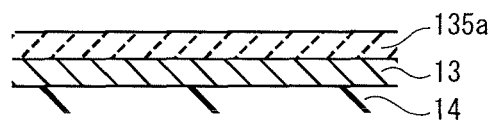
FIGS. 15A-15D are cross-sectional diagrams of a variant manufacturing process for the organic electroluminescence display panel shown in FIG. 1.

First, as shown in FIG. 15A, the first conductive layer 13 of tungsten is deposited on the substrate that includes the insulating layer 14, and silicon nitride material for the passivation layer 113d is further deposited thereon.

Figure 15B:
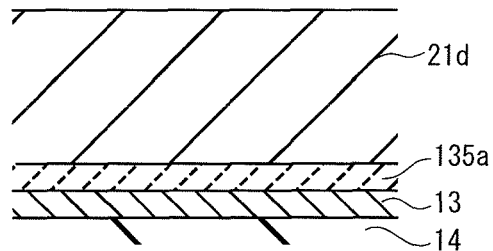
Figure 15C:
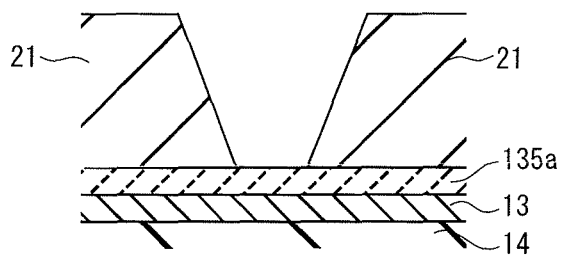

Next, as shown in FIGS. 15B and 15C, the organic insulating layer 21 with an aperture therein is formed over the passivation layer 113d material, using the photolithography and etching technology discussed with reference to FIGS. 3B and 3C.

Figure 15D:
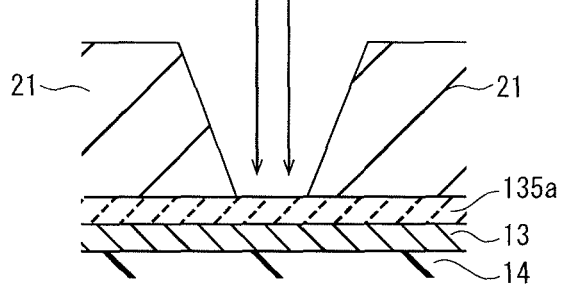

Furthermore, as shown in FIG. 15D, a reactive etching method employing tetrafluoromethane, for example, is used to cause the silicon nitride forming part of the passivation layer 113d material to react with radical gases from the tetrafluoromethane, to be removed upon gasification. The conditions for the reverse sputtering method are that a DC sputtering device having parallel plane electrodes is used, the DC power is no less than 0.25 kW and no more than 1.0 kW, the argon gas pressure is no less than 0.7 Pa and no more than 7.0 Pa, the tetrafluoromethane gas flow is no less than 100 sccm and no more than 200 sccm, and the molecular oxygen gas flow is no less than 0 sccm and no more than 50 sccm. Here, the reactive etching is known to have a higher etching rate than the reverse sputtering using inert gas. Therefore, the reactive etching of the passivation layer 113d material using tetrafluoromethane progresses faster than the etching by reverse sputtering of the passivation layer 113d material using argon gas. The removal of the passivation layer 113d material is beneficially performed until the passivation layer 113d reaches a thickness required for forming the intermediate layer 135b as desired.

Figure 16A:
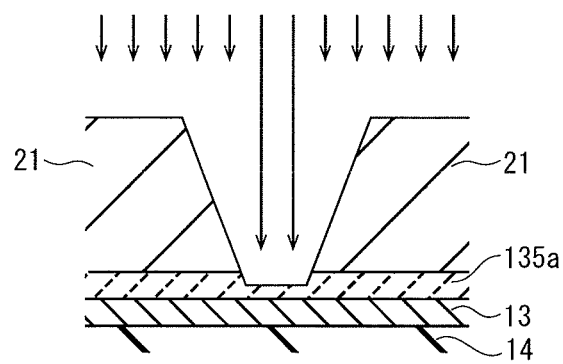
FIGS. 16A-16C are cross-sectional diagrams of a variant manufacturing process for the organic electroluminescence display panel shown in FIG. 1.

Due to the reactive etching using tetrafluoromethane, once the passivation layer 113d material has been removed to a certain degree, as shown in FIG. 16A and described with reference to FIG. 4A, the reverse sputtering using an inert gas such as argon causes a portion of the passivation layer 113d material layer of silicon nitride to adhere to the inner circumferential face of the aperture in the organic insulating layer 21. In the present variation, ions of the inert gas such as argon collide with the silicon nitride of the passivation layer 113*d* material in the direction shown by the arrows, and cause the silicon nitride to fly off the passivation layer 113*d* material. Most of the silicon nitride that flies off adheres to the inner circumferential face of the aperture in the organic insulating layer 21.

Figure 16B:
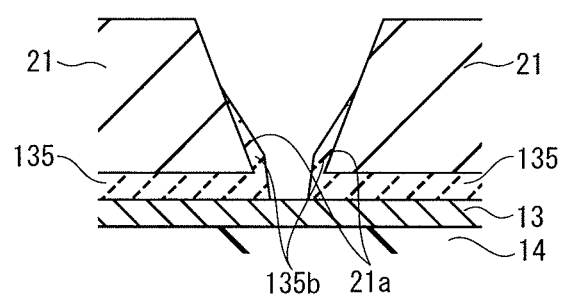

As a result of the process illustrated in FIG. 16A, FIG. 16B shows the formation of the intermediate layer 35 on the inner circumferential face 21*a* of the aperture in the organic insulating layer 21.

Figure 16C:
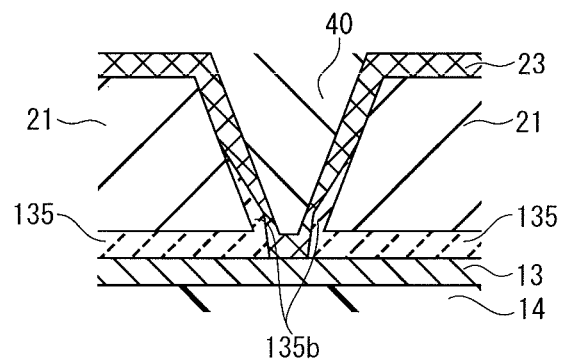
Figure 17:
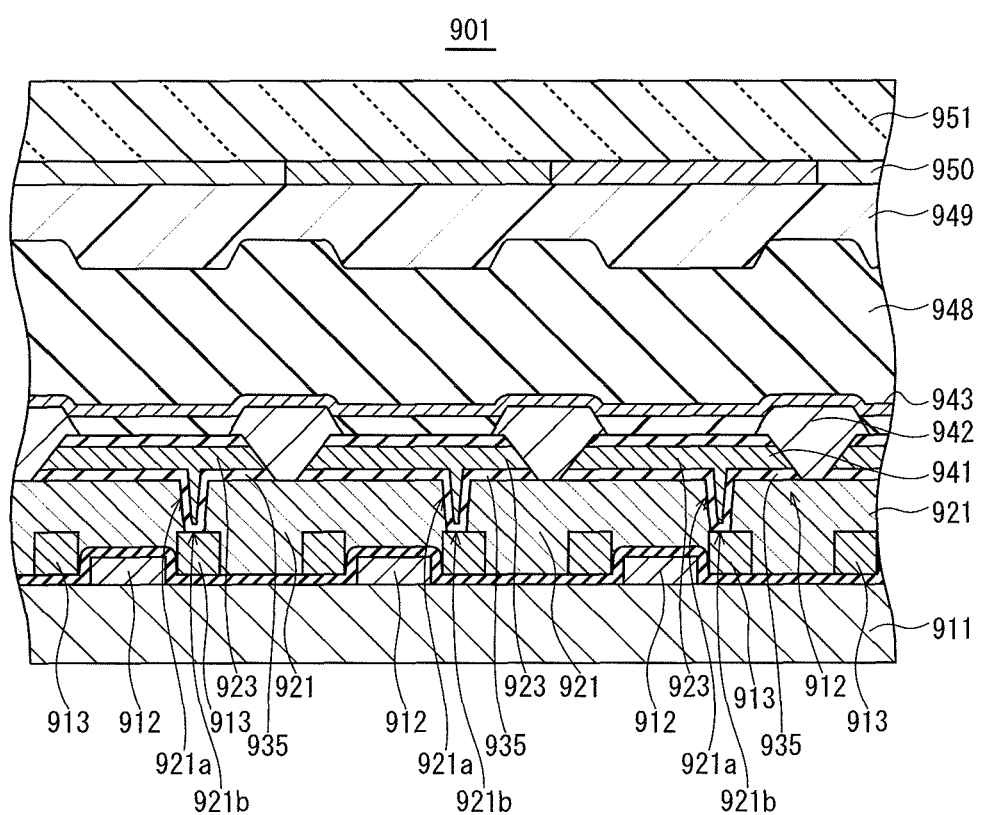
FIG. 17 is a cross-sectional diagram of an organic electroluminescence display panel pertaining to conventional technology.

Afterward, as shown in FIG. 16C, the second conductive layer 23 formed and the partition 40 is formed in the aperture of the organic insulating layer 21, similar to FIG. 4C.

3. Spreading Range of Intermediate Layer

In the above-described Embodiments, the intermediate layer spreads only as far as halfway along the first conductive layer-facing side of the inner circumferential face of the aperture in the organic insulating layer. However, the intermediate layer may also extend along the entirety of the inner circumferential face of the aperture in the organic insulating layer.

4. Manufacturing Method for Intermediate Layer

In the above-described Embodiment, the intermediate layer is formed by reverse sputtering. However, dry etching with argon gas may also be uses to form the intermediate layer.

5. Other Configurations

In the above-described Embodiments, the light-emitting layer is made from an organic light-emitting material. However, no particular limitation is intended. Provided that at least an organic electroluminescence layer is included, the configuration may also include material layers for a hole injection layer, a hole transport layer, an electron injection layer, an electron transport layer, and so on, as needed. Also, the first electrode layer need only be formed of a highly conductive material. No particular limitation to tungsten is intended, and any of molybdenum, titanium, chromium, and copper may be used. The second conductive layer is not particularly limited to being aluminium or an aluminium alloy, but may be any material having sufficient conductivity and optical reflectivity, such as a silver alloy.

6. Application of Disclosure to Other Electronic Device

The present disclosure may be used for an electronic device and take, in addition to the first conductive layer that serves as an SD electrode and the second conductive layer that serves as an anode, a conductive layer, an organic insulating layer having an aperture, and a metallic layer in a laminar structure. The aperture in the organic insulating layer may be configured to enable contact between the conductive layer and the metallic layer.

For example, this may be used for contact between the gate electrode 12 of the TFT substrate and the first conductive layer 13, as shown in FIG. 1. Of course, the disclosure may be used for liquid crystal applications as well, in which the contact hole is present through an insulating layer in an organic material.

INDUSTRIAL APPLICABILITY

The present disclosure is widely applicable to electronic devices such as organic electroluminescent elements, and is particularly applicable to a display panel using organic electroluminescent elements.

REFERENCE SIGNS LIST

1 Organic electroluminescence display panel
11 Glass substrate
13 First conductive layer
21 Organic insulating layer
21*a* Inner circumferential face of aperture in organic insulating layer
21*b* Bottom face of aperture in organic insulating layer
23 Second conductive layer
35 Intermediate layer

The invention claimed is:

1. An electronic device, comprising:
a substrate;
a first conductive layer disposed over the substrate;
an organic insulating layer disposed over the first conductive layer and having an aperture through which a portion of the first conductive layer is exposed;
a second conductive layer, which is metallic, covering a top face of the organic insulating layer, an inner circumferential face that faces the aperture in the organic insulating layer, and the portion of the first conductive layer that is exposed; and
an intermediate layer that includes one of an oxide and a nitride, disposed only on a half-part of the inner circumferential face that faces the aperture in the organic insulating layer, the half-part being arranged near the first conductive layer, wherein
the first conductive layer and the second conductive layer are in contact within the aperture in the organic insulating layer.

2. The electronic device of claim 1, wherein
the first conductive layer is made from a metal, and
the intermediate layer is made from an oxide of the metal.

3. The electronic device of claim 1, wherein
the intermediate layer is made from a conductive oxide material.

4. The electronic device of claim 1, further comprising
an insulating layer made from one of an oxide and a nitride, disposed between the first conductive layer and the organic insulating layer, and having a corresponding aperture that corresponds with the aperture in the organic insulating layer through which the portion of the first conductive layer is exposed, wherein
an intermediate layer material and an insulating layer material are identical.

5. The electronic device of claim 1, wherein
the first conductive layer is made from a metal, and
a metallic layer of the metal is further disposed between the intermediate layer and the second conductive layer.

6. The electronic device of claim 1, wherein
the first conductive layer is made from a metal,
a metallic oxide layer is disposed between the first conductive layer and the organic insulating layer, the metallic oxide layer including an oxide of the metal, and
a region of the first conductive layer that is directly covered by the organic insulating layer has greater surface roughness than another region of the first conductive layer that is exposed through the organic insulating layer.

7. The electronic device of claim 1, wherein
the first conductive layer is made from a metal, and
an oxide layer is an oxide of the metal disposed on a region of the first conductive layer covered by the organic insulating layer, between the first conductive layer and the organic insulating layer.

8. The electronic device of claim 1, wherein
the first conductive layer is made from a metal including at least one of tungsten, molybdenum, titanium, chromium, and copper.

9. The electronic device of claim 1, wherein
the second conductive layer is made from one of an aluminium alloy and a silver alloy.

10. A manufacturing method for an electronic device, comprising:
preparing a substrate;
forming, from a metal, a first conductive layer over the substrate;
forming, from an organic material, an organic insulating layer over the first conductive layer so as to have an aperture exposing a portion of the first conductive layer;
forming an intermediate layer that includes one of an oxide and a nitride, only on a half-part of an inner circumferential face of the organic insulating layer that faces the aperture in the organic insulating layer, by sputtering at least a surface of the first conductive layer that is exposed through the aperture in the organic insulating layer, the half-part being arranged near the first conductive layer; and
forming a second conductive layer, which is metallic, so as to cover a top face of the organic insulating layer, the inner circumferential face of the aperture in the organic insulating layer, and the portion of the first conductive layer that is exposed.

11. The manufacturing method for the electronic device of claim 10, wherein
the oxide or the nitride in the intermediate layer is a metal oxide or a metal nitride of the metal forming the first conductive layer.

12. The manufacturing method for the electronic device of claim 11, further comprising
oxidising at least the top face of the first conductive layer, between the forming of the first conductive layer and the forming of the intermediate layer.

13. The manufacturing method for the electronic device of claim 11, further comprising
forming, from the metal in the first conductive layer, a metallic layer over the intermediate layer by sputtering the surface of the first conductive layer between the forming of the intermediate layer and the forming of the second conductive layer.

14. A manufacturing method for an electronic device, comprising:
preparing a substrate;
forming, from a metal, a first conductive layer over the substrate;
forming, from one of an oxide and a nitride, an insulating layer over the substrate and the first conductive layer;
forming, from an organic material, an organic insulating layer over the first conductive layer and opening an aperture that exposes a portion of the first conductive layer;
forming an intermediate layer from the same material as the insulating layer, only on a half-part of an inner circumferential face of the organic insulating layer that faces the aperture in the organic insulating layer, by removing a partial surface of the insulating layer through sputtering so as to expose a top face of the first conductive layer and sputtering at least the surface of the insulating layer that is exposed through the aperture in the organic insulating layer, the half-part being arranged near the first conductive layer; and
forming a second conductive layer, which is metallic, so as to cover the top face of the organic insulating layer, the inner circumferential face of the aperture in the organic insulating layer, and the portion of the first conductive layer that is exposed.

15. The electronic device of claim 1, wherein
the second conductive layer is directly on the top face of the organic insulating layer.

16. The electronic device of claim 1, wherein
the second conductive layer is directly on at least a part of the inner circumferential face that faces the aperture in the organic insulating layer.

17. The electronic device of claim 1, wherein
the intermediate layer directly contacts the second conductive layer and at least a part of the inner circumferential face that faces the aperture in the organic insulating layer.

18. The electronic device of claim 1, wherein
the intermediate layer increases in thickness in the aperture in a direction approaching the substrate.

19. The electronic device of claim 1, wherein
the portion of the first conductive layer that is exposed through the aperture has a thickness that is less than other portions of the first conductive layer that are not exposed through the aperture.

20. The manufacturing method for the electronic device of claim 10, wherein
in the forming the intermediate layer, the sputtering is performed by causing inert gas ions to collide with at least the surface of the organic insulating layer that is exposed through the aperture in the organic insulating layer, such that atoms constituting the first conductive layer fly off at least the surface and adhere to the inner circumferential face of the aperture in the organic insulating layer.

* * * * *